(12) United States Patent
Mollard et al.

(10) Patent No.: US 10,177,193 B2
(45) Date of Patent: Jan. 8, 2019

(54) ARRAY OF MESA PHOTODIODES WITH AN IMPROVED MTF

(71) Applicant: Commissariat a l'Energie Atomique et aux Energies Alternatives, Paris (FR)

(72) Inventors: Laurent Mollard, Claix (FR); Nicolas Baier, Saint-Nazaire les Eymes (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 14/705,078

(22) Filed: May 6, 2015

(65) Prior Publication Data
US 2015/0349151 A1    Dec. 3, 2015

(30) Foreign Application Priority Data
May 27, 2014    (FR) .................................. 14 01208

(51) Int. Cl.
*H01L 31/18* (2006.01)
*H01L 27/144* (2006.01)
(Continued)

(52) U.S. Cl.
CPC .... *H01L 27/14678* (2013.01); *H01L 27/1443* (2013.01); *H01L 27/14649* (2013.01);
(Continued)

(58) Field of Classification Search
CPC ......... H01L 27/14678; H01L 31/02966; H01L 31/1032; H01L 31/1828
See application file for complete search history.

(56) References Cited

U.S. PATENT DOCUMENTS

| 4,137,544 A | 1/1979 | Koehler |
| 4,369,756 A * | 1/1983 | Ezoe ....................... F02P 15/12 123/179.5 |

(Continued)

FOREIGN PATENT DOCUMENTS

| CA | 1 296 640 | 4/1992 |
| EP | 0 229 574 | 7/1987 |

(Continued)

OTHER PUBLICATIONS

U.S. Appl. No. 14/795,129, filed Jul. 9, 2015, Mollard et al.

(Continued)

*Primary Examiner* — Yu Chen
*Assistant Examiner* — Vincent Wall
(74) *Attorney, Agent, or Firm* — Oblon, McClelland, Maier & Neustadt, L.L.P.

(57) ABSTRACT

An array of mesa photodiodes, including a useful layer of $Cd_xHg_{1-x}Te$ wherein pads are formed. The array includes a first doped zone having a first N or P doping; and second doped zones having a second P or N doping of a different type from that of the first doping, and each extending on an upper region of a pad. The first doped zone includes at least one first region having a first doping density, located at least under each of the pads; and at least one second region, located between two neighboring pads, and having a second doping density higher than the first doping density, each second region being separated from the closest second doped zone by at least one portion of the first region.

10 Claims, 5 Drawing Sheets

(51) Int. Cl.
*H01L 27/146* (2006.01)
*H01L 31/103* (2006.01)
*H01L 31/0296* (2006.01)
*H01L 31/0352* (2006.01)

(52) U.S. Cl.
CPC .. *H01L 31/02966* (2013.01); *H01L 31/03529* (2013.01); *H01L 31/035281* (2013.01); *H01L 31/1032* (2013.01); *H01L 31/1832* (2013.01)

(56) References Cited

U.S. PATENT DOCUMENTS

| | | | |
|---|---|---|---|
| 4,588,446 A | | 5/1986 | Tregilgas |
| 4,639,756 A | * | 1/1987 | Rosbeck ............ H01L 27/14649 257/442 |
| 4,791,467 A | * | 12/1988 | Amingual ............. H01L 31/101 257/183.1 |
| 4,875,084 A | | 10/1989 | Tohyama |
| 4,961,098 A | | 10/1990 | Rosbeck et al. |
| 4,972,244 A | * | 11/1990 | Buffet ................. H01L 27/1446 257/442 |
| 4,984,032 A | | 1/1991 | Miura et al. |
| 5,376,558 A | | 12/1994 | Sudo et al. |
| 5,449,944 A | | 9/1995 | Sudo et al. |
| 5,466,953 A | | 11/1995 | Rosbeck et al. |
| 5,880,510 A | * | 3/1999 | Cockrum .......... H01L 31/02161 257/442 |
| 5,952,703 A | * | 9/1999 | Murakami .......... H01L 31/1032 257/188 |
| 6,005,276 A | | 12/1999 | Forrest et al. |
| 6,030,853 A | | 2/2000 | Tregilgas |
| 6,034,407 A | | 3/2000 | Tennant et al. |
| 6,489,653 B2 | | 12/2002 | Watanabe |
| 6,747,296 B1 | | 6/2004 | Clark |
| 6,803,557 B1 | | 10/2004 | Taylor et al. |
| 7,459,730 B1 | | 12/2008 | Kinch |
| 7,504,672 B1 | | 3/2009 | Kinch |
| 7,608,830 B1 | | 10/2009 | Kinch |
| 7,936,034 B2 | * | 5/2011 | Rothman .............. H01L 27/144 257/438 |
| 7,936,043 B2 | * | 5/2011 | Degani .................. H01L 21/84 257/528 |
| 8,232,560 B2 | | 7/2012 | Robin et al. |
| 8,541,256 B2 | | 9/2013 | Wan |
| 8,772,717 B2 | | 7/2014 | Mitra |
| 8,835,949 B2 | | 9/2014 | Lee |
| 2003/0034496 A1 | | 2/2003 | Yoneta et al. |
| 2003/0071221 A1 | | 4/2003 | Mitra |
| 2003/0227064 A1 | | 12/2003 | Maeda |
| 2005/0045910 A1 | | 3/2005 | Taylor et al. |
| 2005/0082630 A1 | | 4/2005 | Yamanaka |
| 2007/0029485 A1 | | 2/2007 | Beck et al. |
| 2007/0034898 A1 | | 2/2007 | Tennant et al. |
| 2007/0075224 A1 | | 4/2007 | Jones et al. |
| 2007/0075344 A1 | | 4/2007 | Yamanaka |
| 2007/0197022 A1 | | 8/2007 | Hails et al. |
| 2009/0236525 A1 | | 9/2009 | Mitra et al. |
| 2009/0256231 A1 | | 10/2009 | Klipstein |
| 2010/0010779 A1 | | 1/2010 | Rostaing et al. |
| 2010/0102336 A1 | | 4/2010 | Lee |
| 2010/0117183 A1 | | 5/2010 | Rothman et al. |
| 2010/0148289 A1 | | 6/2010 | McCarten et al. |
| 2010/0230720 A1 | | 9/2010 | Wicks |
| 2011/0018087 A1 | | 1/2011 | Boutami et al. |
| 2011/0031401 A1 | | 2/2011 | Mitra et al. |
| 2011/0095334 A1 | | 4/2011 | Scott |
| 2011/0096208 A1 | | 4/2011 | Roy et al. |
| 2011/0227091 A1 | | 9/2011 | Toda |
| 2012/0012816 A1 | | 1/2012 | Choi |
| 2012/0061785 A1 | | 3/2012 | Ishikawa et al. |
| 2012/0146174 A1 | | 6/2012 | Zeman et al. |
| 2013/0168792 A1 | | 7/2013 | Haddad et al. |
| 2014/0183682 A1 | | 7/2014 | Rothman |
| 2014/0183683 A1 | | 7/2014 | Rothman |
| 2014/0312446 A1 | | 10/2014 | Gravand et al. |
| 2014/0319580 A1 | | 10/2014 | Mollard et al. |
| 2014/0339570 A1 | | 11/2014 | Mollard et al. |
| 2014/0346539 A1 | | 11/2014 | Mollard et al. |
| 2015/0008551 A1 | | 1/2015 | Gravand et al. |

FOREIGN PATENT DOCUMENTS

| | | |
|---|---|---|
| EP | 0 325 532 | 7/1989 |
| EP | 0 350 351 A1 | 1/1990 |
| EP | 0 445 545 A1 | 9/1991 |
| EP | 1 280 207 | 1/2003 |
| EP | 1 677 353 | 7/2006 |
| EP | 2276072 A1 | 1/2011 |
| EP | 2 315 251 | 4/2011 |
| FR | 2 983 351 | 5/2013 |
| GB | 2206447 | 1/1989 |
| JP | 62-119976 | 6/1987 |
| WO | 2008 043786 | 4/2008 |
| WO | 2010 074288 | 7/2010 |
| WO | 2010/140621 | 12/2010 |
| WO | WO 2013/079447 | 6/2013 |

OTHER PUBLICATIONS

U.S. Appl. No. 14/686,084, filed Apr. 14, 2015, Laurent Mollard et al.

French Preliminary Search Report dated Jan. 16, 2015 in French Application 14 01208, filed on May 27, 2014 ( with English Translation of Categories of Cited Documents).

Written Opinion dated Jan. 16, 2015 in French Patent Application No. 1401208 (submitting English translation only).

European Search Report dated Sep. 17, 2015 in Patent Application No. 15169098 (with English translation of categories of cited documents and English translation of Written Opinion).

International Search Report dated Aug. 5, 2013 in PCT/EP2013/062771 filed Jun. 19, 2013.

French Preliminary Search Report dated Apr. 11, 2013 in French Patent Application No. 1255786 filed Jun. 20, 2012.

D. Stanaszek, et al., "Mid and long infrared detection modules for picosecond range measurements," SPIE, Conference Proceedings, Electro-optical remote Sensing, Photonic Technologies and Applications III, vol. 7482, XP040502300, Sep. 1, 2009, pp. 74820M-1-7482M-11.

J. Piotrowski, et al., "Uncooled long wavelength infrared photo detectors", Infrared Physics and Technology, vol. 46, No. 1-2, XP025960146, Dec. 1, 2004, pp. 115-131.

French Preliminary Search Report dated Jan. 8, 2015 in French Application 14 00950, filed on Apr. 22, 2014 (with English Translation of Categories of Cited Documents).

French Preliminary Search Report dated Apr. 30, 2015 in French Application 14 01585, filed on Jul. 16, 2014 (with English Translation of Categories of Cited Documents).

International Search Report dated Jan. 4, 2013 in PCT/EP12/073710 filed Nov. 27, 2012.

French Search Report dated Sep. 26, 2012 in FR 1160900 filed Nov. 29, 2011.

Zha, F. X., et al., "The Blue-shift effect of the ion-milling-formed HgCdTe photodiodes", Proc. of SPIE, vol. 6984, pp. 69840G1-69840G-4, 2008, XP055039157.

Baker, I.M., et al., "Summary of HgCdTe 2 D Array Technology in the U.K.", Journal of Electronic Materials, vol. 30, No. 6, pp. 682-689, XP 055039154, 2001.

K. Jozwikowski, et al., "Generation-Recombination Effect in High-Temperature HgCdTe Heterostructure Nonequilibrium Photodiodes", Journal of Electronic Materials, vol. 38, No. 8 (2009), pp. 1666-1676.

H.F. Schaake, et al., "High-Operating-Temperature MWIR Detector Diodes", Journal of Electronic Materials, vol. 37, No. 9, (2008), pp. 1401-1405.

French Search Report dated Oct. 22, 2013, in French Patent Applicant 1262991 filed Dec. 31, 2012.

International Search Report dated Aug. 5, 2014, in PCT/EP2013/078088, filed Dec. 27, 2013.

(56) References Cited

OTHER PUBLICATIONS

International Search Report dated Jan. 24, 2013, in PCT/EP12/073632, filed Nov. 26, 2012.
International Search Report dated Jan. 4, 2013, in PCT/EP12/073629, filed Nov. 26, 2012.
French Search Report dated Nov. 16, 2012, in French Patent Application No. 12 50086, Filed Jan. 4, 2012.
J.M. Arias, et al., "MBE HgCdTe heterostructure p-on-n planar infrared photodiodes", Journal of Electronic Materials, vol. 22, No. 8, 1993., pp. 1049-1053.
M.A. Kinch, et al., "1/f noise in HgCdTe photodiodes", Journal of Electronic Materials, vol. 34, No. 6, 2005, pp. 928-932.
Li, S.S., "Heavy Doping effects in a degenerate semiconductor", Semiconductor Physical Electronics, 3 pages, (Jan. 1, 2006), XP055049276.
French Preliminary Search Report dated Jan. 15, 2014, in French Application 13 01188, filed on May 24, 2013 (w/English translation of Categories of Cited Documents).
Singh, A., et al., "HgCdTe avalanche photodiodes: A review", Optics & Laser Technology, vol. 43, (2011), pp. 1358-1370, XP028384723.
Wang, S., et al., "Low-Noise Avalanche Photodiodes with Graded Impact-Ionization-Engineered Multiplication region", IEEE Phototonics Technology Letters, vol. 3, No. 12, (Dec. 2001), pp. 1346-1348, XP011426604.
Rothman, J., et al."History-Dependent Impact Ionization Theory Applied to HgCdTe e-APDs", Journal of Electronic Materials, vol. 40, No. 8, (2011), pp. 1757-1768.
Rothman, J., et al."Short-Wave Infrared HgCdTe Avalanche Photodiodes", Journal of Electronic Materials, (2012), (Total pages 9).
Itsuno, A. M. et al., "Design and Modeling of HgCdTe nBn Detector", Journal of electronic Materials, vol. 40, No. 8, pp. 1624-1629, 2011, XP 019921471.
Piotrowski, J., et al., "Dark currents, responsivity, and response time in graded gap HgCdTe structure", Proc. of SPIE, vol. 7660, pp. 766031-1-766031-8, 2010, XP 055044448.
Savich, G.R., et al. "Use of unipolar barriers to block dark currents in infrared detectors", Proc. of SPIE, vol. 8012, pp. 80122T-1-80122T-10, 2011, XP 040562779.
International Search Report dated Jul. 23, 2013, in PCT/EP13/050020, filed Jan. 2, 2013.
Henini, et al., "Handbook of Infrared Detection Technologies", (2015), p. 297.
Foreign Preliminary Search Report dated Apr. 22, 2013, in French Patent Application No. 12 57810, filed Aug. 14, 2012.
International Search report dated Nov. 14, 2013, in PCT/EP13/066779, filed Aug. 12, 2013.

\* cited by examiner

ARRAY OF MESA PHOTODIODES WITH AN IMPROVED MTF

TECHNICAL FIELD

The present invention relates to the field of CdHgTe material based photodiodes, used in particular to detect an infrared radiation.

STATE OF PRIOR ART

Different geometries of photodiodes, in particular the so-called "mesa" photodiodes are known in prior art. A mesa photodiode has a non-planar geometry, wherein a layer of semi-conductor material, called a "useful layer", has a generally planar lower face, and a pad shaped upper face. The lower face can be deposited onto a substrate. Each pad has side walls and an upper wall on the opposite side of the lower face of the useful layer. Such a pad is referred to as "mesa", in reference to its general tray shape.

A zone is referred to as P doped when it has an excess of "holes", or in other words an electron deficiency (minority carriers). A zone is referred to as N doped when it has an electron excess, or in other words a hole deficiency (minority carriers). Throughout the text, the doping type of the doped zone designates the type of the minority carriers in said zone. A P doping can be made by implantation of a so-called acceptor dopant element, that is receiving at least one electron so as to create an electron deficiency. An N doping can be made by implantation of a so-called donor dopant element, that is giving at least one electron so as to create a hole deficiency.

On the side of said upper wall, the pad has a region having an N or P doping, of a different type from that of the doping in the rest of the useful layer, thus forming a PN junction. A PN junction forms a photodiode.

In practice, arrays of several mesa photodiodes are manufactured. FIG. 1 represents an example of such an array, as seen in a cross section view. The array 1 comprises a useful layer 10 deposited onto a substrate 11 (represented hatched). The useful layer 10 has been etched so as to form pads 12. Each pad 12 has a PN junction between a first zone 14 having a first N or P doping, and a second zone 13 having a second P or N doping of a different type from that of the first doping. Each pad has its own PN junction, and thus forms a photodiode.

For example, rectangular arrays gathering 640×512 photodiodes are made, for a 15 μm pitch P (width of a photodiode).

The invention relates more particularly to an array of mesa photodiode, wherein the useful layer is made of a semi-conductor material made of a $Cd_xHg_{1-x}Te$ cadmium, mercury and tellurium alloy, with x a real number between 0 and 1, the bounds being excluded.

One of the characteristic quantities of the optical quality of an array of photodiodes is its modulation transfer function (MTF). It is generally represented by a graph representing a ratio of a measured contrast to a theoretical contrast, as a function of a frequency (here the inverse of a pitch P of the array of photodiodes). The MTF illustrates the capability of the array of photodiodes to faithfully transcribe a distribution of incident photons, in the form of a map of measured currents in the photodiodes. It is thus advantageous that an array of photodiodes has a great MTF, in order to provide an image which faithfully transcribes the reality.

One purpose of the present invention is to provide an array of mesa photodiodes the useful layer of which is of $Cd_xHg_{1-x}Te$, having an improved MTF.

Another object of the present invention is to provide a method for manufacturing an array of photodiodes, enabling an array of mesa photodiodes to be obtained the useful layer of which is of $Cd_xHg_{1-x}Te$ and has an improved MTF.

DISCLOSURE OF THE INVENTION

This purpose is achieved with an array of at least two photodiodes including a useful layer consisting of a $Cd_xHg_{1-x}Te$ type cadmium mercury and tellurium semi-conductor alloy, the useful layer having:
- a base and
- pads, the base forming a common stand for the pads, and each pad corresponding to a photodiode, the useful layer comprising:
- a first doped zone having a first N or P doping, extending at least in said base; and
- for each pad, a second doped zone having a second P or N doping of a different type from that of the first doping, extending at least in an upper region of said pad, on the side of the pad opposite to the base.

According to the invention, the first doped zone comprises:
- at least one first region having a first doping density, located at least under each of said pads; and
- at least one second region, located between two neighboring pads, and having a second doping density higher than the first doping density.

Further, each second region is separated from the closest second doped zone by at least one portion of the first region.

Advantageously, at least one second region extends from the upper face of the useful layer, to a lower face of the useful layer, on the side opposite to the pads. The upper face of the useful layer is the face receiving the pads.

The second region can extend from the upper face of the useful layer, and at least down to a depth corresponding to half the distance separating the upper and lower faces, between two pads.

At least one second region can extend between two neighboring pads and on at least one portion of the side surfaces of said two neighboring pads.

The second doping density is advantageously at least twice higher than the first doping density.

The second doping density can be at least ten times higher than the first doping density.

According to a first embodiment of the invention, the first doped zone is N doped and the second doped zones are P doped.

According to this first embodiment of the invention, the second doped zone can further extend on the side walls of a pad, and have a cadmium concentration higher than the cadmium concentration in the first doped zone.

Preferably, the useful layer is covered, on the side of the pads, with a layer having a cadmium concentration higher than that of the useful layer. This concentration is advantageously a mean volume concentration. This is a non-doped layer.

According to a second embodiment of the invention, the first doped zone is P doped and the second doped zones are N doped, and the at least one second region has a cadmium concentration higher than the cadmium concentration in the first region.

The invention also relates to a method for manufacturing an array of at least two photodiodes according to the invention, comprising the following steps of:

- etching, in a useful layer consisting of a $Cd_xHg_{1-x}Te$ type cadmium mercury and tellurium semi-conductor alloy, at least two pads each associated with a photodiode, the etching preserving a thickness of useful layer, called the base, forming a common stand for the pads;
- creating at least one PN junction, such that the useful layer has:
  - a first doped zone having a first N or P doping, extending at least in said base; and
  - for each pad, a second doped zone having a second P or N doping of a different type from that of the first doping, extending at least in an upper region of said pad, on the side of the pad opposite to the base.

According to the invention, the method comprises a further doping step made by ion implantation between two pads, and so as to form:

- at least one first region having a first doping density, located at least under each of said pads; and
- at least one second region located between two neighboring pads, and having a second doping density, higher than the first doping density.

Further, each second region is separated from the closest second doped zone by at least one portion of the first region.

According to a first embodiment of the method according to the invention, the step of creating at least one PN junction implements an ion implantation of a donor dopant, the further doping step implements an ion implantation of an acceptor dopant, and the method further comprises the following steps of:

- depositing, onto the useful layer, a layer, called a reservoir layer, having a cadmium concentration higher than that of the useful layer;
- annealing the useful layer covered with the reservoir layer performing a diffusion of the cadmium atoms of the reservoir layer, from the reservoir layer to the useful layer.

According to this first embodiment of the method according to the invention, the method can comprise a step of etching a portion of the reservoir layer located above the pads, this step being performing before the annealing.

According to a second embodiment of the method according to the invention, the step of creating at least one PN junction implements an ion implantation of an acceptor dopant onto the side walls and the upper wall of each pad, and the method further comprises the following steps of:

- depositing, onto the useful layer, a layer, called a reservoir layer, having a cadmium concentration higher than that of the useful layer;
- annealing the useful layer covered with the reservoir layer performing a diffusion of the cadmium atoms of the reservoir layer, from the reservoir layer to the useful layer.

BRIEF DESCRIPTION OF THE DRAWINGS

The present invention will be better understood upon reading the description of exemplary embodiments given by way of purely indicating and in no way limiting purposes, with reference to the appended drawings wherein.

DETAILED DISCLOSURE OF PARTICULAR EMBODIMENTS

Figure 2:
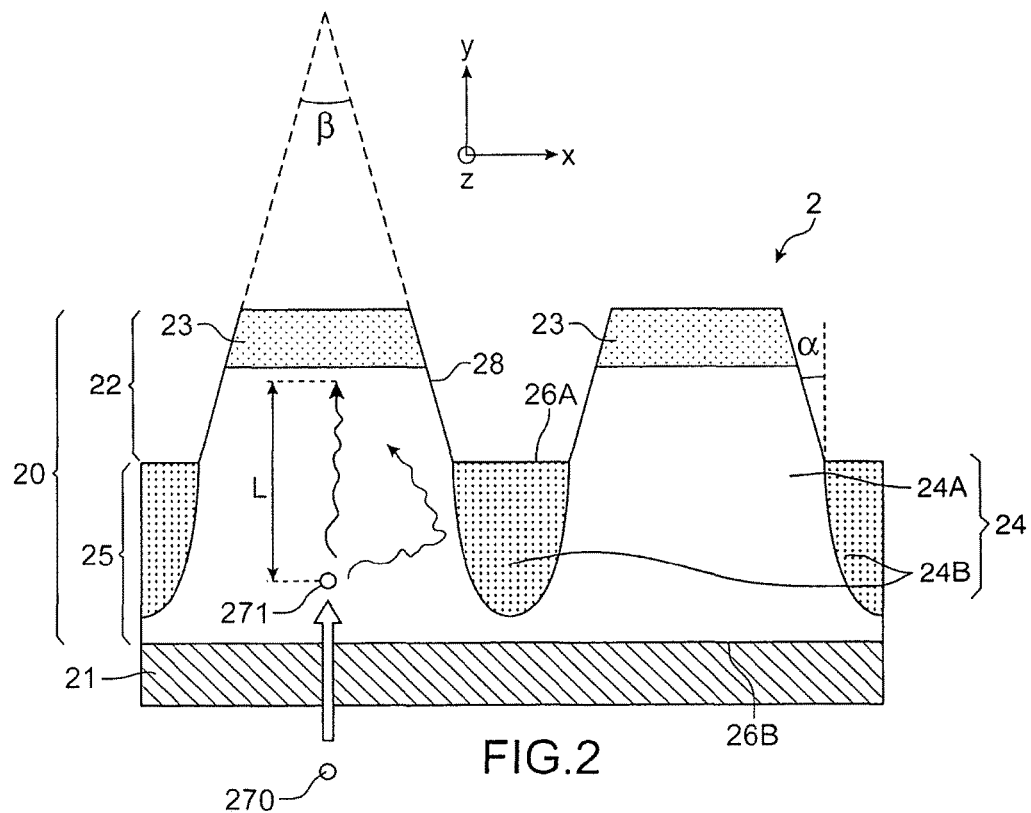
FIG. 2 schematically illustrates a first embodiment of an array of mesa photodiodes according to the invention.

FIG. 2 schematically illustrates, in a cross section view, a first embodiment of an array 2 of photodiodes according to the invention.

Figure 1:
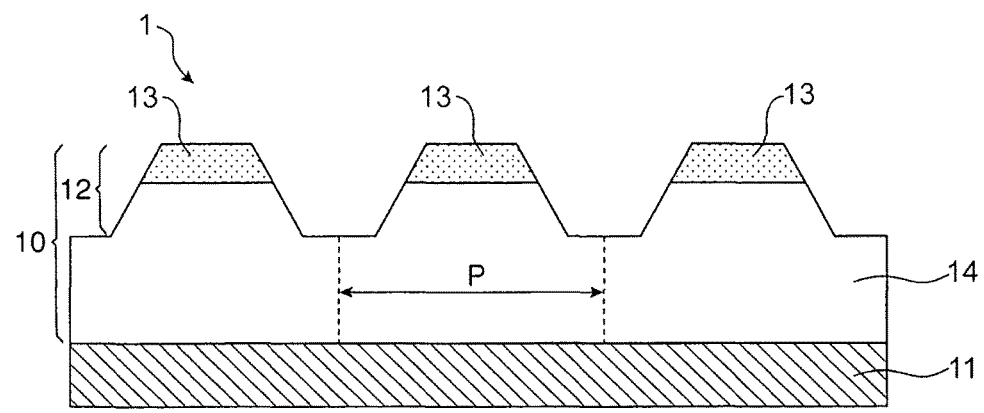
FIG. 1 schematically illustrates an array of mesa photodiodes according to the prior art.

FIG. 2 will be only described as to the differences relative to FIG. 1, corresponding to prior art and described in the introduction.

The array 2 comprises a useful layer 20 of semi-conductor material. The useful layer 20 is formed by a $Cd_xHg_{1-x}Te$ type cadmium, mercury and tellurium alloy, with x between 0 and 1, the bounds being excluded. In particular, x is between 0.2 and 0.5, for example 0.22.

For example, it will be attempted to detect a radiation in middle infrared called MWIR ("Middle Wave Infrared", corresponding to wavelengths between 4 μm and 5 μm), which corresponds, for example, to a cadmium concentration defined by x=0.3.

Alternatively, it is attempted to detect a radiation in far infrared called LWIR ("Long Wave Infrared", corresponding to wavelengths between 8 and 12 μm), which corresponds, for example, to a cadmium concentration defined by x=0.22.

Alternatively, it is attempted to detect a radiation in near infrared called SWIR ("Small Wave Infrared", corresponding to wavelengths between 3 and 4 μm), or in very far infrared called VLWIR ("Very Long Wave Infrared", corresponding to wavelengths higher than 14 μm).

The figures represent the particular case wherein the array comprises a substrate 21, covered with the useful layer 20. According to a not represented alternative, the substrate is separated from the front useful layer, before, during or after the implementation of the method according to the invention. Thus, the array according to the invention does not necessarily comprise a substrate.

The substrate 21 is for example made by a cadmium, zinc and tellurium alloy. Such an alloy provides a very advantageous lattice match with the material of the useful layer. The substrate 21 is transparent to the wavelengths desired to be detected.

As in prior art, the useful layer 20 has:

- pads 22, on the side of an upper face 26A of the useful layer, on the side opposite to the substrate; and
- a base 25, on the side of a lower face 26B of the useful layer, and forming a common stand for the pads.

This structure corresponds to an array of mesa photodiodes, each pad corresponding to a photodiode.

For example, the height of the pads is 5 μm. In other words, the mesa depth is 5 μm. The thickness of the base is for example 1 μm, that is a total thickness of the useful layer of 6 μm.

The lower face 26B of the useful layer is located in the horizontal plane (zOx). The tilting angle of the side walls 28 of the pads, relative to the vertical axis (Oy), is called angle α. This angle α is for example 45°. The side walls of a pad form together an angle β, the vertex of this angle being directed on the side of the pads opposite to the lower face 26B. Any kinds of alternatives will be worth considering, in particular alternatives wherein the side walls of a pad form together an angle β the vertex of which is directed on the side of the lower face 26B.

In the useful layer 20, the following can be distinguished:
a first doped zone 24, here formed in the base as well as in the low part of each of the pads 22 (on the side of the lower face 26B and optionally of the substrate 21); and
in each of the pads, a second doped zone 23 extending in the upper part of the pad (on the side of the upper face 26A).

There is thus a single first doped zone 24, and several second doped zones 23 (one for each pad).

The first doped zone 24 has a first N or P doping. The second doped zones 23 have a second P or N doping, of a different type from that of the first doping. The first doped zone 24 and the second doped zone 23 form together the useful layer 20.

According to the invention, the first doped zone 24 consists of:
at least one first region 24A, located in particular under each of the pads 22, and having a first doping density; and
at least one so-called over-doped second region 24B, located between two neighboring pads, and having a second doping density higher than the first doping density.

Preferably, the at least one first region 24A is located directly below each of said pads, and in the center of each of these pads.

By "between two pads", it is advantageously meant "between two pads and flush with the upper face of the CdHgTe active layer".

The at least one second region 24B advantageously forms a lattice around the pads.

The first region 24A and the second region 24B are not superimposed but laterally adjacent.

A single second region 24B extending between each of the pads of the array of photodiodes can be considered.

Alternatively, the array of photodiodes comprises several second regions 24B, each extending between two neighboring pads. Throughout the following, the example of several second regions 24B is kept.

For example, the doping density in the first region 24A is $8 \times 10^{15}$ atoms/cm$^3$, and the doping density in the second regions 24B is higher than or equal to $10^{16}$ atoms/cm$^3$. The first region 24A and the second regions 24B form together the first doped zone 24.

There is thus a potential barrier formed between a second region 24B and a first region 24A.

In operation, a photon 270 penetrates the useful layer on the side of its lower face 26B, and facing a given photodiode. This photon causes the appearance of a minority carrier 271 in the useful layer 20. This minority carrier 271 diffuses in the useful layer, until it is recombined with a carrier having a different type. If said minority carrier passes through a PN junction before being recombined, it enables a measurable current to be created. The part of the useful layer wherein the absorption of a photon causes the appearance of a minority carrier 271 can be called a "detection zone". The minority carrier has a diffusion length L, which corresponds to the distance it travels before being recombined. When the diffusion length L is high, there is thus a risk that the minority carrier is recombined after passing through the PN junction of a neighboring photodiode. This risk is all the higher that the pitch of the array of photodiodes is low in comparison with the diffusion length L.

But, according to the invention, the array of photodiodes has, between two neighboring photodiodes, an over-doped region 24B which forms a potential barrier for the minority carriers. The minority carriers are thus prevented from passing through the region 24B, which prevents a minority carrier from penetrating the array of photodiode facing a first photodiode, and recombining after passing through the PN junction of a neighboring photodiode. Thus, a minority carrier which penetrates the array of photodiode facing a first photodiode remains enclosed in a corridor between several regions 24B, and thus can only be recombined at the PN junction of said first photodiode, in particular after passing through this PN junction.

It is thus ensured that an incident photon makes appear a current, in the photodiode facing which it penetrates the array of photodiodes.

Thus, an incident photon is prevented from making appear a current in a photodiode other than that facing which it penetrates the array of photodiodes.

Thus, the array of photodiodes according to the invention has an improved MTF.

The invention is particularly advantageous when it is desired that the array of photodiodes has a pitch lower than the diffusion length of the minority carriers. The invention is therefore particularly advantageous in the case where the second doped zones 23 are P doped, and the first doped zone 24 is N doped (so-called "P on N" technology). Indeed, in this technology, the minority carriers have a long lifetime which provides them with long diffusion lengths (in comparison with the so-called "N on P" technology corresponding to N doped zones 23 and a P doped zone 24). The invention is however not limited to the P on N technology, and also covers the N on P technology.

It is also noticed that each second region 24B, since it has the same doping type as the rest of the first doped zone 24, does not prevent all the photodiodes of a same array from being biased using a same electrical contact point, including when it extends to the lower face 26B of the useful layer.

Further, each second region 24B does not have defects at the interfaces with the first region 24A, because both these regions only differ by their doping density.

It is noticed in FIG. 2 that the second doped zones 23 and the second regions 24B are not contiguous, to avoid the creation of a leakage current by a tunnel effect between a second N or P doped zone and a second P or N over-doped region. The distance between a second doped zone 23 and a second region 24A is typically in the order of 2 μm.

In the example represented in FIG. 2, each second region 24B extends, between two pads 22, from the upper face 26A of the useful layer, and towards the lower face 26B. Each second region 24B can extend to the lower face 26B, optionally until it is in contact with the substrate. In this case, several first regions 24A can be defined.

Each second region 24B can extend on at least half the interval separating two neighboring pads (distance between one end of a pad, and the end of the closest neighboring pad).

The invention has an increased interest in the case where the first doped zone 24 is N doped. In this case, degenerated second regions 24B can be obtained, that is the Fermi level of which is lying in the conduction band. Thus, a potential barrier higher than in the absence of degeneracy is made.

In the case where the first doped zone 24 is P doped, it is particularly advantageous that the second regions 24B have a cadmium concentration higher than that of the first region 24A. It has indeed been observed that in a Cd$_x$Hg$_{1-x}$Te semi-conductor material, the band gap, called "gap", depends on the cadmium concentration. The higher this concentration, the higher the gap. The difference in cadmium concentration between a second region 24B and the first region 24A increases the potential barrier made by the difference in doping level between both these regions. In reference to FIG. 7, a method according to the invention has been detailed which enables such a cadmium distribution to be obtained.

Advantageously, the width of the second region 24B tends to decrease as the lower face 26B is closer.

Figure 5:
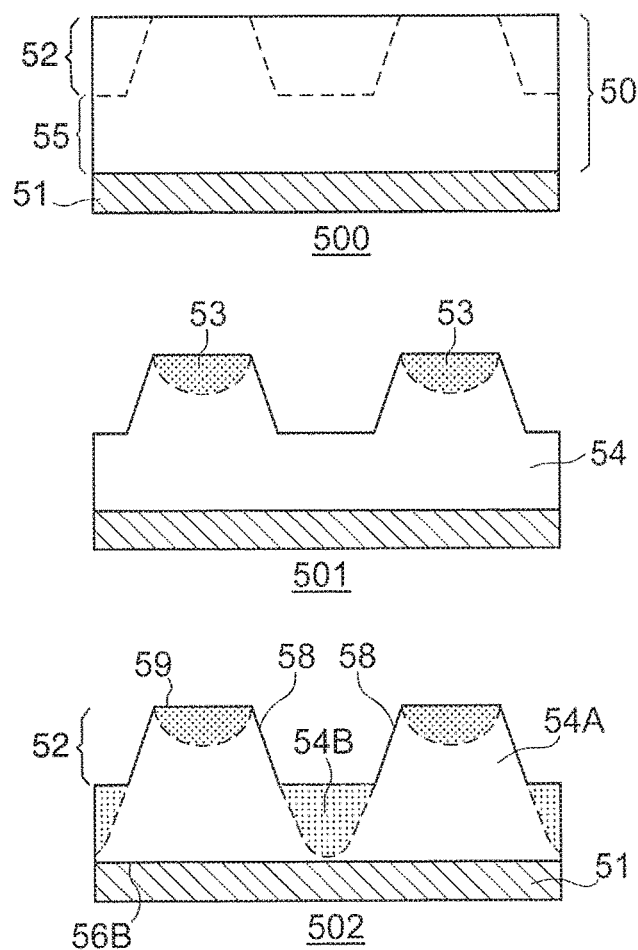
FIG. 5 schematically illustrates a first embodiment of a method according to the invention.

This particular shape of the second region 24B can be obtained by ionic implantation performed such that the distribution of the implanted ions has this particular shape, and the subsequent diffusion of the implanted dopant ions preserves this particular shape (see FIG. 5).

This shape of the second regions 24B can thus create a funnel guide to best collect all the minority carriers, and guide them towards the PN junction facing which the minority carrier has been formed.

Figure 3:
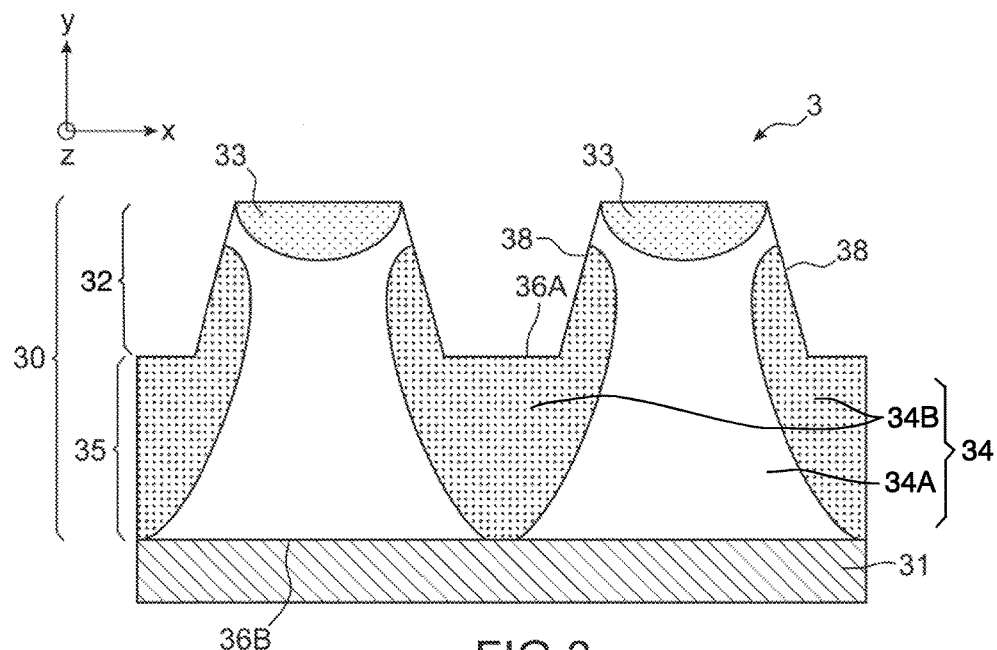
FIG. 3 schematically illustrates a second embodiment of an array of mesa photodiodes according to the invention.

FIG. 3 schematically illustrates a second embodiment of an array of photodiodes according to the invention. FIG. 3 will be only described as to its differences from FIG. 2.

Reference numerals 2, 20, 21, 22, 23, 24A, 24B, 25, 26A, 26B, 28 of FIG. 2 respectively correspond to reference numerals 3, 30, 31, 32, 33, 34A, 34B, 35, 36A, 36B, 38 of FIG. 3.

The side walls 38 of the pads are formed by etching in the useful layer. They thus have material defects, due to etching.

If minority carriers reach these defects, they are very easily recombined on these defects. If this recombination occurs before the carrier arrives to the PN junction of a photodiode, it does not give rise to the creation of a current in the depletion region of a photodiode. Thus, an incident photon actually forms a minority carrier in the useful layer 30, but no corresponding electrical current is measured.

Further, a defect present in the material can be the cause of the creation of minority carriers, even without a photon flux. These carriers will diffuse up to a depletion region (around the PN junction) and create an electrical current. The latter phenomenon will cause a degradation in the dark current. The array of photodiodes 3 thus has degraded detection properties if defects are present in the surroundings or within the depletion region of a photodiode.

To overcome this drawback, it is provided, in the embodiment represented in FIG. 3, that each second region 34B extends between two pads, and also on at least one portion of the side surfaces 38 of said pads. Each second region 34B also extends in the thickness of the useful layer 30, under said portions of side surface. The second regions 34B surround, in the center of a pad, a first region 34A. Said portions of side surface lie in the low part of the pads. Each part of second region 34B located under a portion of side surface 38 is formed as a single piece with a part of second region 34B located between two pads.

By raising each second region 34B up to under the side walls of at least one adjacent pad, potential barriers are formed which prevent minority carriers from reaching the side walls.

Thus, an array 3 of photodiodes having optimum detection properties is made.

As in the embodiment represented in FIG. 2, the second doped zones 33 and the second regions 34B are not contiguous.

As for the embodiment represented in FIG. 2, each second region 34B can extend in the useful layer to its lower face 36B, optionally until it is in contact with the substrate 31.

Figure 4:
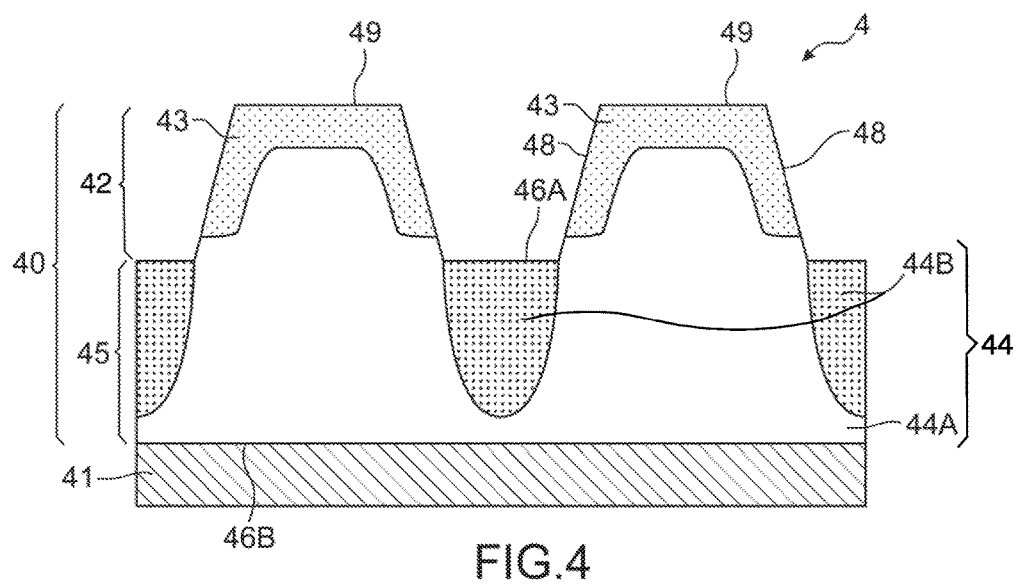
FIG. 4 schematically illustrates a third embodiment of an array of mesa photodiodes according to the invention.

A third embodiment of an array of photodiodes according to the invention will now be described in reference to FIG. 4. FIG. 4 will be only described as to its differences in comparison with FIG. 2.

The reference numerals 2, 20, 21, 22, 23, 24, 24A, 24B, 25, 26A, 26B, 28 of FIG. 2 respectively correspond to the reference numerals 4, 40, 41, 42, 43, 44, 44A, 44B, 45, 46A, 46B, 48 of FIG. 4.

As for the embodiment represented in FIG. 2, each second region 44B can extend in the useful layer to its lower face 46B, optionally until it is in contact with the substrate 41.

The first doped zone 44 is N doped, and the second doped zones 43 are P doped.

As explained in reference to FIG. 3, the side walls 48 of the pads are formed by etching in the useful layer. This etching can form defects in the material, at the etched interface of the useful layer. These material defects will promote the introduction of an intermediate energy level in the gap of the material. This intermediate energy level then promotes a spontaneous gap crossing by an electron. This spontaneous gap crossing creates an electron-hole pair, and thus the appearance of a minority carrier in the useful layer. If this minority carrier is recombined, after passing through a PN junction, an electrical current which does not correspond to the absorption of a photon is measured. This phenomenon results in increasing the dark current. The dark current is the residual electrical current of a photodetector in the absence of illuminance. Thus, a high dark current will restrict the detection of very small infrared radiations.

The higher the gap of a material, the least probable the appearance of an intermediate energy level in the material results in a spontaneous gap crossing by an electron. Therefore, it is advantageous that the gap of the material in the proximity of the side walls 48 is high.

In the embodiment of FIG. 4, it is provided that for each pad 42, the gap of the useful layer is high in proximity of the side walls 48. This effect is achieved by a higher cadmium concentration in proximity of the side walls 48, in comparison with the cadmium concentration elsewhere in the useful layer 40 and in particular in the first doped region 44A. Indeed, as previously set out, it has been observed that in a $Cd_xHg_{1-x}Te$ material, the gap depends on the cadmium concentration. The higher this concentration, the higher the gap.

Advantageously, the cadmium concentration is higher in the proximity of the side walls 48 and the upper wall 49 of a pad, and the zone having a high cadmium concentration corresponds to the second doped zone 43. It will be seen in the description with reference to FIG. 6, that it is actually a configuration that can be particularly easily made.

Thus, an array 4 of photodiodes is made wherein the impact of defects related to the mesas etching is minimized and thus for which the dark current is minimized.

It could be observed that it would be sufficient to increase the cadmium concentration in the entire useful layer 40, to achieve the same effect. However, the wavelength of the detected radiation would be modified and it would be no longer possible for example to detect very long wavelengths, in particular in so-called LWIR or VLWIR infrared.

Indeed, a photodiode only enables wavelengths to be detected the energy of which substantially corresponds to the gap of the material of the detection zone, located in the base 45 of the useful layer. A low gap corresponds to the detection of a radiation of a long wavelength, and conversely. Therefore, a low gap is preserved in the base 45, in particular in the first doped region 44A, in order to be able to detect long wavelengths. Thus, an array 4 of photodiodes is made, having a reduced dark current and enabling long wavelengths to be detected, for example MWIR or LWIR wavelengths.

For example, the first doped zone 44 extends in the base 45, in a lower part of the pads and in the center of the pads. The second doped zones 43 extend for example from the upper wall 49 and the side walls 48, on a thickness of useful layer between 1 µm and 2 µm. The second doped zones 43 have a cadmium concentration corresponding for example to $x=0.3$ or $x=0.5$ in $Cd_xHg_{1-x}Te$. At the interface with the first doped zone 44, the cadmium concentration dramatically decreases to reach a concentration defined by $x=0.22$.

For each photodiode, the depletion region extends around the PN junction, on a part of the second doped zone 43 and a part of the first doped zone 44.

Second doped regions 43, being P doped, can be obtained by arsenic doping. They typically have a density of majority carriers in the order of $10^{18}$ atoms/cm$^3$. The first doped zone 44, being N doped, in turn has, in its first region 44A, a density of majority carriers typically in the order of $8\times10^{15}$ atoms/cm$^3$. The depletion region of each photodiode preferentially extends on the less doped side, thus on the side of the first doped zone 44. However, the gap in the second doped zone 43 is sufficiently high with respect to the gap in the first doped zone 44, for a mean gap in the depletion region higher than the gap in the first doped zone 44 to be obtained all the same.

Thus, the embodiment illustrated in FIG. 4 further enables the mean gap to be increased in the depletion regions, while allowing the detection of long wavelengths, for example MWIR or LWIR wavelengths.

The increase in the mean gap in the depletion regions enables the spontaneous creation of minority carriers by a generation-recombination phenomenon to be restricted therein. Thus, the increase in the mean gap in the depletion regions also contributes to reducing the dark current of the array of photodiodes according to the invention.

It is noticed that the gap difference between a second doped zone 43 and the first doped zone 44, due to the difference in cadmium concentration, is not sufficient to create a potential barrier which would prevent the minority carriers formed in the base 45 from reaching the PN junction. This effect is achieved without necessarily taking particular precautions.

An exemplary method for manufacturing an array of photodiodes according to the invention will now be described.

In a step 500, a useful layer 50 of $Cd_xHg_{1-x}Te$ is etched, to form pads 52 called mesa on a substrage 51. The etching preserves a thickness of useful layer designated "base" 55, which forms a common stand for the pads 52. To each pad will correspond a photodiode, a photodiode being defined by a PN junction, and possibly metal connectors to bias this junction. Step 500 is a conventional etching step of a mesa photodiode, and will not be further described. This etching can be a wet etching or a dry etching.

During a step 501, a PN junction is made in each of the pads 52. This PN junction corresponds to an interface between a first N or P doped zone 54, and a second P or N doped zone 53.

This junction can be made according to one of numerous known techniques.

For example, P doped second zones 53 are made within an N doped material, by ion implantation of a P dopant (acceptor dopant) in the useful layer 50. For example, arsenic is implanted, with an implantation energy of 300 keV and a dose of $8\times10^{15}$ atoms/cm$^2$. Then, a suitable annealing is performed at about 400° C. to activate the P dopant. This annealing creates mercury vacancies in the entire useful layer 50. Therefore, it is obtained a strongly P doped second region 53 (thanks to the arsenic implantation) and a faintly P doped first zone 54 (because of the mercury vacancies). Then, a suitable annealing is performed at about 220° C. to fill the mercury vacancies. The faintly P doped first zone 54 becomes N doped.

Alternatively, a highly N doped second zone 53 could be made in a P doped material. For this, an annealing is performed to adjust the level of mercury vacancies, so as to P dope the layer. Then, an N dopant element is implanted in the useful layer 50, for example boron, indium or else, to form the second doped zones 53.

It could also be considered to implement step 500 after step 501 of creation of a PN junction. In this case, the creation of at least one PN junction implements a simple deposition of two layers having different types. For example, an upper layer of $Cd_xHg_{1-x}Te$ further containing arsenic atoms is deposited above a $Cd_xHg_{1-x}Te$ layer, so as to finally obtain an N doped layer topped by a P doped layer forming together the useful layer. The subsequent etching 500 enables pads 52 each having a PN junction to be separated (see FIG. 2).

According to the invention, the method for manufacturing an array of photodiodes further comprises a step 502 of over-doping regions 54B located between two neighboring pads 52.

This step is implemented before step 500 and before or after step 501.

This step 502 implements an ion implantation between two pads 52 so as to form, in the first doped zone 54:
  at least one first region 54A having a first doping density, and located at least under each of said pads; and
  at least one second region 54B, located between two neighboring pads, and having a second doping density, higher than the first doping density.

According to a first example, firstly there is a first doped zone 54, being N doped with a doping density of $8\times10^{15}$ atoms/cm$^3$. Then, a second region 54B is made by implantation of indium or boron atoms or other in this first doped zone 54. This ion implantation locally increases the doping density in the first doped zone 54, dividing the same into a second region 54B and a first region 54A.

In the case of boron, an implantation energy of 300 keV is used and with a dose of $5\times10^{14}$ atoms/cm$^2$. The implantation energy determines an implantation depth of the boron atoms in the useful layer.

The boron atoms quasi-isotropically diffuse in the useful layer from their implantation point (diffusion preferentially in depth in the useful layer). The size of each second region 54B can therefore be controlled by controlling the implantation energy and doping density implemented during this step 502. For example, the second region 54B can be made such that it extends or not up to the lower face 56B, and/or it extends or not under a portion of the side walls 58. An implantation can also be made such that the quasi-isotropic diffusion of the atoms forms funnel shaped passages for minority carriers in the first region 54A and between regions 54B. These passages then guide a minority carrier to the PN junction facing which this minority carrier has been formed.

According to a second example, firstly there is a first doped zone 54, being P doped with a doping density of $10^{16}$ atoms/cm$^3$. Then, a second region 54B is made by implanting arsenic atoms in this first doped zone 54. This ion implantation enables the doping density to be locally increased in the first doped zone 54, dividing the same into a second region 54B and a first region 54A.

The arsenic atoms are implanted with an energy of 300 keV and with a dose of $8 \times 10^{15}$ atoms/cm$^2$, to form a second region 54B in the first doped zone 54. Following this implantation, it is necessary to perform a suitable annealing around 400° C. to obtain a P type doping. The implantation energy and the diffusion related to the annealing determine an implantation depth of the arsenic atoms in the useful layer. The arsenic atoms quasi-isotropically diffuse in the useful layer from their implantation point. The size of the second region 54B can therefore be controlled by controlling the implantation energy and doping energy implemented during this step 502. For example, a second region 54B can be made such that it extends or not up to the lower face 56B, and/or it extends or not under a portion of the side walls 58.

Conventional steps of setting up at least one electrical contact element in contact with the useful layer could then be carried out. This electrical contact element enables the photodiode to be electrically biased.

The ion implantation step 502 is implemented from the surface of the useful layer which is located between the pads 52.

Thus, with a moderate implantation energy, a potential barrier extending in the useful layer (considered in particular from the upper wall 59 of the pads) can be made.

The diffusion distance in the useful layer of the injected dopant elements is related to their implantation energy. According to the invention, reduced implantation energies are used, which corresponds to a reduced diffusion distance of the dopant elements after they have been injected. It is advantageous to resort to a reduced diffusion distance, (related in practice to implantation energies in the order of 100-400 keV), because this diffusion is also lateral (quasi-isotropic, and not entirely isotropic diffusion). If the diffusion length were too long compared to the pitch of the array photodiodes, the side extent of the second regions 54B thus obtained would impede the access of the minority carriers to a PN junction, or would even prevent it. Consequently, photodiodes having poor quantum efficiencies would be obtained.

For this reason, the implantation energy cannot be very high and a good quality of the MTF can only be obtained by combining it with a mesa structure.

The method according to the invention thus enables an array of photodiodes according to the invention to be made in an energy saving, simple and clever way.

Figure 6:
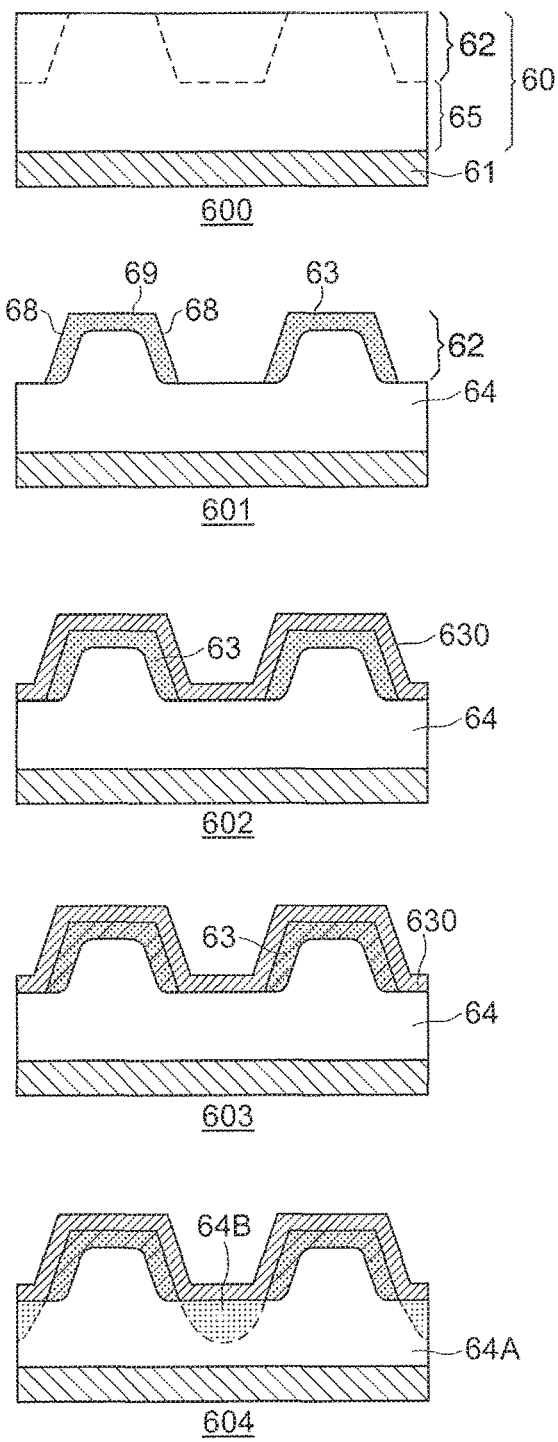
FIG. 6 schematically illustrates a second embodiment of a method according to the invention.

FIG. 6 more particularly illustrates a method according to the invention for manufacturing an array of photodiode as illustrated in FIG. 4.

Step 600 corresponds to step 500 as described in reference to FIG. 5. Reference numerals 50, 51, 52, 55 respectively correspond to reference numerals 60, 61, 62, 65.

In a second step 601, a PN junction is made in each of the pads 62. This PN junction corresponds to an interface between an N doped first zone 64, and a P doped second zone 63. As described in reference to FIG. 5, such doped zones are obtained by implanting a P dopant such as arsenic. For each pad 62, the ion implantation is performed from the side walls 68 and the upper wall 69, so as to make a second zone 63 which is P doped and located under said side walls 68 and said upper wall 69. The center of each pad is N doped, and corresponds to the first doped zone 64. Likewise, the first doped zone 64 extends between the pads and from the upper face of the active layer.

During a third step 602, a cadmium rich reservoir layer 630 is deposited on the top of the useful layer 60. The reservoir layer 630 is made of a binary, ternary, or quaternary, or higher material. This material advantageously comprises elements belonging to columns II and VI of the periodic table. It is for example and in a non-limiting way CdS, CdSe, CdTe, CdZnSe, CdMnSSe, etc.

The reservoir layer 630 has a thickness of several thousands angstroms, for example 1 μm.

The deposition of the reservoir layer 630 is performed by any known thin layer deposition technique.

Optionally, a step (not represented) of removing the part of the reservoir layer 630 which is located between the pads, in contact with the first doped zone 64, can be provided. Then, only the part of the reservoir layer 630 located in contact with the second doped zone 63 is preserved. Such a step can implement depositing a resin layer, etching the resin layer by lithography, etching the reservoir layer through apertures made in the resin layer, and removing the resin layer. Etching the reservoir layer is advantageously a chemical etching. However, the reservoir layer 630 is preferably preserved intact in practice.

During step 603, a suitable annealing of the assembly formed by the useful layer 60 and the reservoir layer 630 (which has been possibly etched) is performed. This annealing will be for example performed at a temperature between 100° C. and 500° C., preferably between 300° C. and 500° C., and for a duration that can range from a few minutes to several hours. For example, the annealing corresponds to a heating at 430° C., for 50 hours.

During this annealing, the cadmium atoms of the reservoir layer 630 will diffuse in the second doped zones 63.

The cadmium atoms very preferentially diffuse in a P doped zone highly doped, and the gap depends on the cadmium concentration, that is why the diffusion annealing finally forms a gap opening located in the second doped zones 63. In other words, the second doped zones 63 will have a mean gap energy value higher than that of the first region 64A. It can be mentioned that the P doping density obtained in the second doped zones 63 is in practice in the order of $10^{18}$ atoms/cm$^3$. For such values, the gap gradient made in the second doped zones 63 and the first doped zone 64 (in particular the first regions 64A) does not prevent the minority carriers for reaching the PN junction.

During a step 604, the over-doped regions 64B are formed by ion implantation of an N dopant such as boron or indium or other one. Depending on the case, all or part of the layer corresponding, after annealing, to the reservoir layer 630 can be removed or preserved. The boron implantation can be made through this layer, that is why it is not necessary to remove it to make the second regions 64B. It is even preferred to preserve it.

According to an alternative of this method, a single annealing performs both a cadmium diffusion and a P dopant activation.

Figure 7:
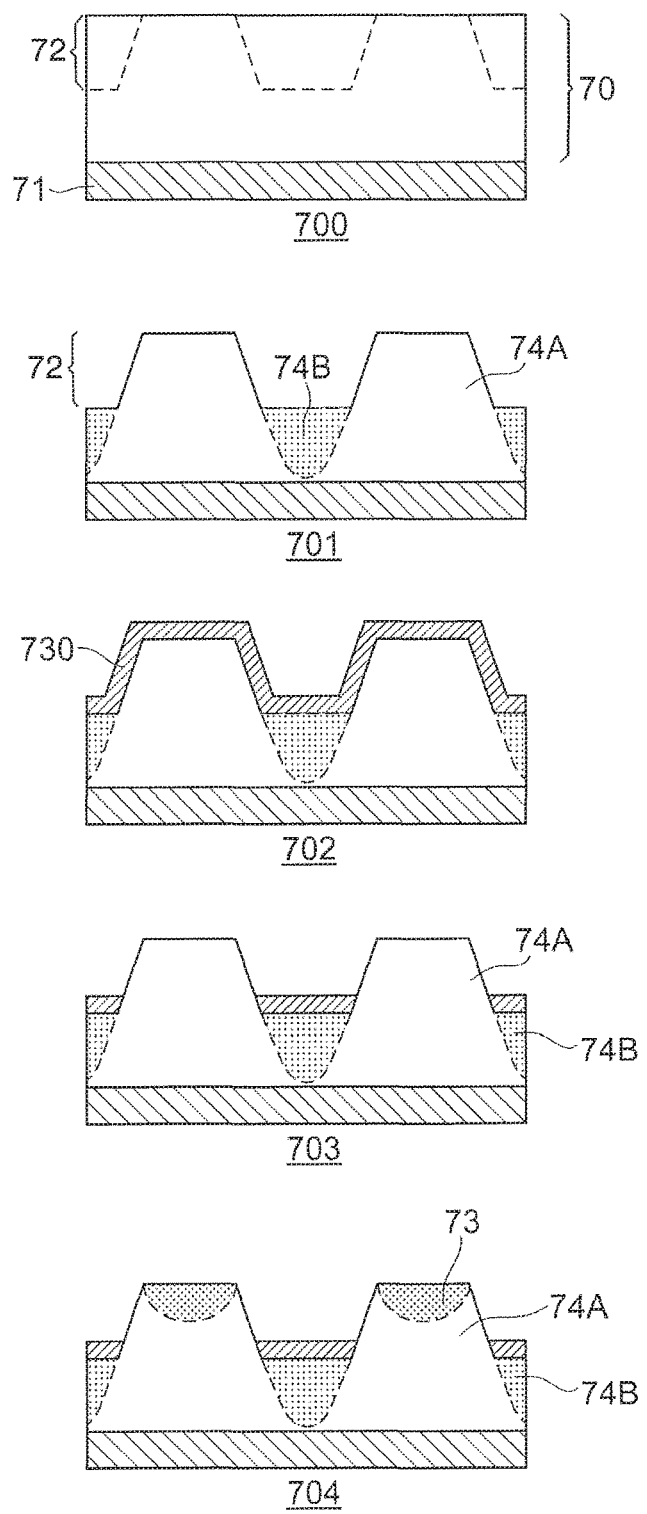
FIG. 7 schematically illustrates a third embodiment of a method according to the invention.

FIG. 7 illustrates another example of the method according to the invention.

Reference numerals 50, 51, 52, 53, 54, 54A, 54B correspond to reference numerals 70, 71, 72, 73, 74A, 74B respectively.

Step 700 corresponds to the step 500 as described in reference to FIG. 5.

During a step 701, the over-doped regions 74B are formed, by ion implantation between the pads 72, of an acceptor dopant element such as arsenic. After activation annealing of the P dopant, second regions 74B which are P over-doped are thus obtained, the rest of the useful layer being P doped.

During a second step 702, a cadmium rich reservoir layer 730 is deposited on the top of the useful layer 70. The details about this step 702 and the reservoir layer 730 correspond to what is detailed above in reference to FIG. 6 and about step 602 and the reservoir layer 630.

The method advantageously comprises a step of structuring the reservoir layer 730. The aim is to remove a part of the reservoir layer 730 lying on the pads, in particular above the region of the useful layer which is not P over-doped (or which is not intended to become so after an activation annealing of a P dopant). Such a step can implement depositing a resin layer, etching the resin layer by lithography, etching the reservoir layer through apertures made in the resin layer and removing the resin layer. Etching the reservoir layer is advantageously a chemical etching using a bromine solution.

During step 703, an annealing of the assembly formed by the useful layer 70 and the reservoir layer 730 (which has possibly been structured as illustrated in FIG. 7) is performed. This annealing will be for example performed at a temperature between 100° C. and 500° C., preferably between 300° C. and 500° C., and for a duration that can range from a few minutes to several hours. For example, the annealing corresponds to a heating at 430° C., for 50 hours.

During this annealing, the cadmium atoms of the reservoir layer 730 will diffuse in the second regions 74B. Therefore, this can be defined to as a diffusion annealing. As previously set out in reference to FIG. 6, the cadmium atoms very preferentially diffuse in a P doped zone highly doped, that is why the diffusion annealing finally forms a cadmium box here located in the second regions 74B.

According to an alternative of this method, a single annealing makes both diffusion and an activation of the P dopant.

Thus, second regions 74B which are over-doped and having a high cadmium concentration are obtained.

During step 704, an ion implantation of an N dopant (donor dopant) such as boron or indium or other is made, so as to form in each pad a PN junction between an N doped second doped zone 73, and the P doped first doped zone. The P doped first doped zone is comprised of the over-doped second regions 74B, the rest of this first zone forming the first region 74B.

The invention is not restricted to the examples just described, and numerous alternatives could be considered, for example arrays having other doping densities, methods implementing other implantation energies or other dopants.

The invention claimed is:

1. An array of at least two mesa photodiodes, comprising:
   a semiconductor layer of a semi-conductor alloy comprising cadmium, mercury, and tellurium as represented by a formula of $Cd_xHg_{1-x}Te$,
   wherein the semiconductor layer comprises:
      a base, and
      at least two pads,
   wherein the base forms a common stand under the pads, and each pad corresponds to a photodiode and has side walls;
   wherein the semiconductor layer has a doping type distribution as follows:
      a first N or P doping in a first doped zone, extending at least in the base, and
      a second P or N doping different from the first doping in a second doped zone above the first doped zone, extending at least in an upper region of each pad;
   wherein the first doped zone has a doping density distribution as follows:
      a first doping density in at least one first region, which is located at least under each pad, and
      a second doping density higher than the first doping density in at least one second region, which is located in at least a region in the base between two neighboring pads,
   wherein each second region is separated from the closest second doped zone by at least a portion of the first region;
   wherein the at least one second region extends from the region in the base between the two neighboring pads up to and along at least one portion of the side walls of the two neighboring pads;
   wherein the second doped zone in each pad has changing thicknesses along a direction from one side wall of the pad to the other side wall of the pad with a maximum thickness in the middle; and
   wherein the second doped zone in each pad has a curved shape.

2. The array according to claim 1, wherein the second doping density is at least twice higher than the first doping density.

3. The array according to claim 1, wherein the second doping density is at least ten times higher than the first doping density.

4. The array according to claim 1, wherein the first doped zone is N doped and the second doped zones are P doped.

5. The array according to claim 1, wherein the first doped zone is P doped and the second doped zones are N doped, and the at least one second region has a cadmium concentration higher than the cadmium concentration in the first region.

6. The array according to claim 1, wherein 0<x<1.

7. The array according to claim 6, wherein 0.2≤x≤0 5.

8. The array according to claim 1, wherein the at least one second region extends over more than half of the thickness of the base of the semiconductor layer.

9. The array according to claim 1, further comprising a substrate,
   wherein the substrate is covered with the semiconductor layer, and the at least one second region contacts the substrate.

10. The array according to claim 1, wherein the side walls of each pad have a tilting angle of 45° relative to an axis vertical to the base.

* * * * *